(12) United States Patent
Lacerda

(10) Patent No.: US 6,388,585 B1
(45) Date of Patent: May 14, 2002

(54) METHOD FOR DATA COMPRESSION AND DECOMPRESSION USING DECOMPRESSION INSTRUCTIONS

(76) Inventor: Carlos Bettencourt Lacerda, 140 Heritage Rd., North Kingstown, RI (US) 02852-1921

(*) Notice: Subject to any disclaimer, the term of this patent is extended or adjusted under 35 U.S.C. 154(b) by 0 days.

(21) Appl. No.: 09/605,281

(22) Filed: Jun. 28, 2000

Related U.S. Application Data

(63) Continuation-in-part of application No. 09/132,855, filed on Aug. 11, 1998.

(51) Int. Cl.[7] .............................. H03M 7/34; H03M 7/38
(52) U.S. Cl. ........................................................ 341/51
(58) Field of Search .............................. 341/50, 51, 55, 341/61, 63

(56) References Cited

U.S. PATENT DOCUMENTS 4,597,057 A * 6/1986 Snow ............................ 341/60
5,051,745 A * 9/1991 Katz ............................ 341/51

* cited by examiner

Primary Examiner—Peguy JeanPierre

(57) ABSTRACT

A method for data compression and decompression using a decompression language that consists of decompression instructions that are specified by using 3 bits to define which instruction and its syntax. There are nine decompression instructions, and each has a specific syntax, such as which character, or address length, position or distance, number of positions, etc. Two of the decompression instructions are specified by the same 3-bits and must be differentiated by a fourth bit. The compression method uses a character searcher that determines the locations for a particular character and produces optimum decompression instructions based upon repeated search results. The process is repeated for each unique character within the data. The compressed output may also be compressed by repeating the compression method until further compression can not be achieved or to maximum compression level 31. Decompression is accomplished by executing the decompression instructions until compression level zero is reached to reproduce the original data without any data loss.

6 Claims, 8 Drawing Sheets

| Instr. | Decompression Description | Syntax |
|---|---|---|
| 000 | Do not execute, get next instruction | 000 |
| 001 | Beginning of compressed segment, CompLevel, length (pad last byte of segment with zeros if necessary) | 001, 5-bit CompLevel, length in bytes (4-byte number) with padding of last byte |
| 010,0 | Original data segment, length descriptor for length and units of string, length, original data (bits or bytes) | 010,0, 4-bit length descriptor, numeric length (1 or 2 or 3 or 4 or 5 byte number), original data |
| 010,1 | Produce background character string, length descriptor, numeric length of string, 8-bit background character | 010,1, 2-bit length descriptor, length (1, 2, 3, or 4 byte number), 8-bit background character |
| 011 | Change current character to 8-bit character (current position reset to 0) | 011, 8-bit character code |
| 100 | From current position go to relative position and insert multiple current character, each at character interval | 100, distance (1-byte number), additional positions (4-bit number), character interval between each (4-bit number) |
| 101 | From current position go to relative position and insert multiple current character, each at character interval | 101, distance (2-byte number), additional positions (1-byte number), character interval between each (1-byte number) |
| 110 | From current position go to relative position and insert multiple current character, each at character interval | 110, distance (3-byte number), additional positions (2-byte number), character interval between each (2-byte number) |
| 111 | Go to absolute position and insert multiple current character, each at character interval | 111, absolute position (4-byte number), additional positions (4-byte number), interval between each (4-byte number) |

Fig. 2 a) AABBBBBABAABCABAABAABAACABAAA...AAA
b) 001,00000;00000000;00000000;00000000;11010111;010,0,1001;11010101,AABBBBBABAABCABAABAABAACABAAA...AAA
c) 20$_x$,00$_x$,00$_x$,00$_x$,D7$_x$,49$_x$,D5$_x$,AABBBBBABAABCABAABAABAACABAAA...AAA
d)

| Char. | Count | Coded Instructions |
|---|---|---|
| 00$_x$ | 3 | 011,00$_x$;100,00000010,0010,0001 |
| 20$_x$ | 1 | 011,20$_x$;100,00000001,0000,0000 |
| 49$_x$ | 1 | 011,49$_x$;100,00000110,0000,0000 |
| A | 200 | 010,1,00,11011100,A |
| B | 11 | 011,B;100,00001010,0110,0011;100,00000001,0011,0001;100,00010110,0000,0000 |
| C | 2 | 011,C;100,00010100,0001,1011 |
| D5$_x$ | 1 | 011,D5$_x$;100,00000111,0000,0000 |
| D7$_x$ | 1 | 011,D7$_x$;100,00000101,0000,0000 |
|  | 220 | Total number to compress, which is the number to use for A above, DC$_x$ = 11011100. Some will be overwritten. | e) 10001111111111111111111111111111...111
f) 1FFF1111111111111111111111111111...111
g) 000000000BBBBB0B00B00B00B00B0000B000...000
h) 000000000FBBFB0F00F00F00F00F0000B000...000
i) 000000000FFFFF0F00F00F00F00F0000B000...000
j) 000000000FFFFF0F00F00F00F00F0000F000...000
k) 001,00001,00000000,00000000,00000000,22$_x$;010,1,00,DC$_x$,A;011,00$_x$;100,00000010,0010,0001;011,20$_x$;100,00000001,0000,0000;011,49$_x$;100,00000110,0000,0000;011,B;100,00001010,0110,0011;100,00000001,0011,0001;100,00010110,0000,0000;011,C;100,00010100,0001,1011;011,D5$_x$;100,00000111,0000,0000; 011,D7$_x$;100,00000101,0000,0000,00

Fig. 2A

METHOD FOR DATA COMPRESSION AND DECOMPRESSION USING DECOMPRESSION INSTRUCTIONS

This application is a continuation-in-part of Ser. No. 09/132,855 filed Aug. 11, 1998.

FIELD OF THE INVENTION

The present invention concerns a method for data compression using a decompression language's decompression instructions that are specified by using 3 bits to define which instruction and its syntax. There are 9 instructions, and each has a specific syntax, and may specify which character, number of bytes, position or distance, number of additional positions, repetition interval, etc. Two of the decompression instructions are specified by the same 3-bits and must be differentiated by a fourth bit. Decompression is accomplished by executing the decompression instructions until compression level zero is reached to reproduce the original data without any data loss. These methods may also be used for encryption.

DESCRIPTION OF THE PRIOR ART

Many data compression methods have been developed over the years to provide efficient data storage and transmission. The data are compressed by identifying redundant data, and providing means to replace them. One such popular method is described in U.S. Pat. No. 5,051,745 where redundant string segments are replaced by codes designating the location and length of matching string segments. U.S. Pat. No. 4,597,057 describes a system for compressing 8 bit ASCII coded English language text using coded strings of 4 bit nibbles. Matching string segments are replaced by 4 bit nibbles that specify the type and location of specific characters in tables.

U.S. Pat. No. 4,903,018 describes a method of compressing data by considering it as rows and columns, forming a two dimensional structure. The lines may have varying line lengths, and must first be sorted by index, in either increasing or decreasing line length. The lines are compressed where possible and the columns are compressed where possible. A line segment of identical characters produces a code that specifies the position, number, and character. A fill character, to maintain the structural integrity of the lines and columns replaces these characters. These fill characters are not considered during the column by column compression. A column segment of identical characters also produces a code that specifies the position, number, and character. A fill character to
maintain structural integrity also replaces the characters. U.S. Pat. No. 5,502,439 describes a method for compressing data that is based on LZSS compression methods. It creates a flag bit buffer for the temporary storage of flag bits produced during normal LZSS compression. A "1" bit signifies the next byte is original data, a "0" signifies that the next data are codes for the number of characters, and starting position to obtain the matching original data. The flag bit buffer is latter appended to the end of the compressed output. U.S. Pat. No. 5,729,223 describes a method of compression that first counts the number of occurrences for each possible character, $00_X$ to $FF_X$, in hexadecimal notation or 0 to 255 in decimal notation, and uses the unused and least used character codes as escape characters to identify escape sequences. Two matching blocks of data that are offset from each other by a multiple of N are replaced by escape sequences that specify the size and offset multiple factor of the matching block of data. The number N is equal to 4 on a 32 bit computer, i.e., it signifies 4 bytes per 32 bit word. The definitions of the escape characters and escape sequences must accompany the compressed data for proper expansion.

U.S. Pat. No. 5,734,340 describes a method for compressing File Allocation Tables (FAT) and similar structures that have runs of consecutive numbers and runs of intervening codes. The method generates a plurality of variable length code sequences where each code sequence specifies a particular consecutive run. Each code sequence contains a header that specifies several properties and may also contain an intervening run length, consecutive number run length, and jump value pointer, each varying from 0 to 4 bytes.

U.S. Pat. No. 6,021,198 describes a method for transmitting a file where the file may be variably compressed, by varying the compression level, i.e., the degree of compression to improve throughput of each 32 k byte data block. These and other methods sequentially search the input data for redundant data that have been observed previously and sequentially output data or replacement codes to an output file, or are transmitted. This sequential progression through the data, from one position, specifying data or replacement codes, then to the next position is very restrictive in the amount of redundant data that can be identified.

SUMMARY OF THE INVENTION

The limitations and disadvantages associated with the sequential progression through the data, from position to next position and specifying the data or replacement codes are eliminated by this invention. Instead of sequentially progressing from position to position, and specifying data or replacement codes, each unique 8-bit character that is in the data is chosen one at a time, and all its positions are specified using decompression instructions. Each character is eight bits, so that there are 256 possible characters to investigate. Whether the data are in bits, ASCII, EBCDIC or any other code is irrelevant. The decompression instructions may themselves be compressed by using this method for further compression, producing a new set of decompression instructions at a higher level of compression. All of the 8-bit characters are initially identified and counted. The character with the greatest count is chosen as the background character to reproduce the data. A specific decompression instruction is produced that will accomplish this when decompressing the compressed data, and will produce a string whose length is equal to the input data, and is filled with the background character, the one with the greatest count. This background character's count is then set to zero. Each unique character with a count greater than zero is then investigated individually and its positions are identified and decompression instruction codes are produced that will position the character at the proper positions when decompressing. Therefore instead of going to a position and specifying a character or group of characters, this invention specifies a character and identifies all of its positions using decompression instructions. This invention provides a set of decompression instructions and methods of producing them. This invention also describes a character searcher for finding multiple instances of a particular character within a string and producing an optimum decompression instruction. This invention does not require the data to be sorted, or for the data to be considered as rows and columns as in U.S. Pat. No. 4,903,018. This invention works linearly with the data. It does not require escape sequence definitions to be included with the compressed data as in U.S. Pat. No. 5,729,223. It does not append flag bits to the end of the compressed output as in U.S. Pat. No. 5,502,439. This invention does not require the segment of the data that is to be compressed, to be contiguous in rows or columns as in U.S. Pat. No. 4,903,018. This invention looks for a character that is any linearly equidistant number of characters apart, starting with 1 and upward, then produces a particular decompression instruction that specifies the position of the first character, the number of additional identical characters, and the interval between each identical character. For example, it may find 5 "B" characters that are each 7 characters apart, and produce a decompression instruction to position these 5 "B" characters. This invention works with a particular character until all of its positions have been accounted for and decompression instructions have been produced. Then progresses to the next character that is contained within the data.

Decompression is a simple matter of following the decompression instructions to reach compression level zero, and reproduce the original data without any loss. This invention is most applicable to large sets of data, where a character's multiple positions may be advantageously identified and optimum decompression instructions produced.

BRIEF DESCRIPTION OF THE DRAWINGS

For a better understanding of the invention, reference is made to the following detailed description of the preferred embodiment in conjunction with the accompanying drawings, in which:

FIG. 2 is a table of the decompression language instructions

FIG. 2A is a list of strings and a table of instructions for specific sample data

DESCRIPTION OF THE PREFERRED EMBODIMENT

Figure 1:
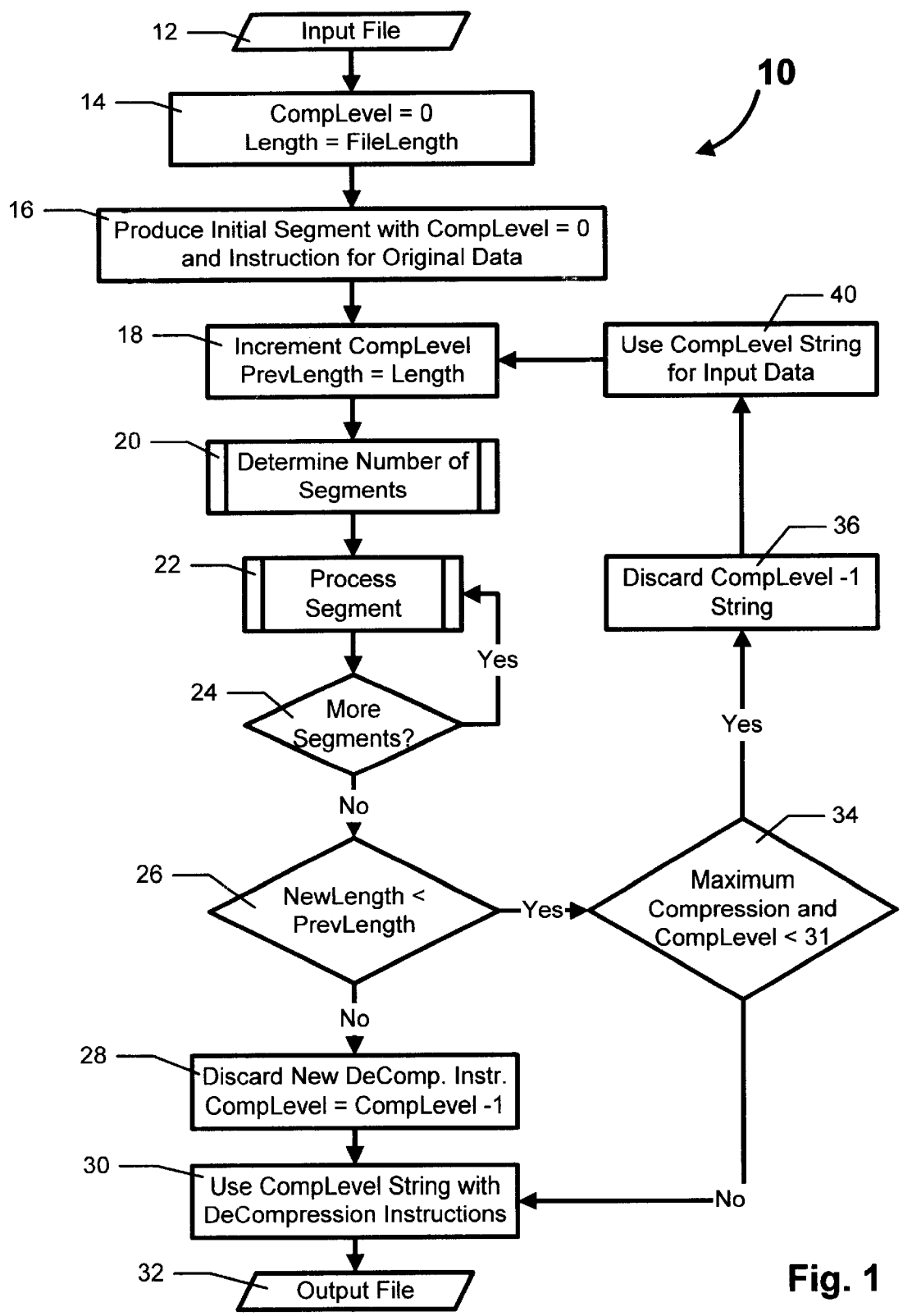
FIG. 1 is a flowchart of the compression method

FIG. 1 illustrates one part of the invention, compression routine 10. It is based upon an 8-bit long character, and therefore 256 possible characters. Preliminary procedures for recording the file name, length, etc. may be accomplished as practiced in the art. An input file 12 or string of data is analyzed as practiced in the art to determine if the original data are an integral number of bytes, and if not then its length must be counted in bits. Process 14 initializes the compression level to zero and sets the data length to the file length or string length in bytes and can be accomplished as practiced in the art. Process 16 produces an initial segment instruction with the 5-bit compression level equal to zero: {001, 00000, length of segment in bytes (4-bytes)}. Since this instruction specifies the length of the following segment in byte units, the segment may need padding of the last byte with zeros so that the segment ends on a byte boundary. The segment consists of an original data instruction and all of the original data and is specified as: {010, 0, a 4-bit length and units descriptor, length of original data in bytes or bits, original data}. The decompression codes used in this specification use "0" to indicate binary 0 and "1" to indicate binary 1, and use semicolons or brackets { } to separate instructions, and commas to separate fields within instructions. Semicolons, brackets and commas are not part of the code. Process 18 increments the compression level by one and stores the length of the previous string in a variable such as PrevLength. Routine 20 determines the number of segments or sections required to compress the previous segment, based upon the data length, and available memory, and can be performed as practiced in the art. A segment may be very large and therefore may be divided into several sections, and each section would produce a compressed sub-segment at the next compression level. The data may be stored in a file or an array, depending upon its length. The number of segments required, start position, length, and end position must be stored in variables and can be performed as practiced in the art. If more than one segment is required then a primary segment decompression instruction is produced with the length field set to zero, and this instruction's length will be set to the length of its sub-segments, after all of its sub-segments have been produced. Routine 22 processes a segment or subsegment to produce decompression instructions and will be described later in FIG. 3. Decision 24 checks if there are more segments to process. If there are more segments, then program flow returns to routine 22 to process the segment, otherwise it progresses to decision 26 which checks if the length of the string containing the current decompression instructions is less than the previous length. If decision 26 is Yes, then decision 34 tests a flag that the user would have initially set before processing began to indicate whether he wants the processing to continue until no more compression can be accomplished, and whether the compression level is less than 31. If decision 34 is No, then process 30 writes the current decompression instructions that were developed to an output file. If maximum compression is desired and the compression level is less than 31, then decision 34 is Yes, and then progresses to 36 which discards the previous CompLevel-1 decompression instructions since they are no longer needed in the procedure, and frees up memory. The location of the previous string may be in a file or in an array in memory, based upon the available memory, and can be determined by those practiced in the art. Process 40 makes the current compression level set of decompression instructions available for input into 18 to continue the compression process. Eventually the process ends when the most recent set of decompression instructions is longer than the previous set of decompression instructions, and decision 26 is No and proceeds to 28 which discards the new set of decompression instructions and decrements the compression level CompLevel by one. Process 30 sends the previous CompLevel set of decompression instructions to output file 32. This process would again start at step 12, if there were other files to compress, and would append the results to the compression file.

FIG. 2 is a table of Decompression Instructions developed by this invention. Three bits permit 8 unique instructions to be defined. Two instructions share the same 3-bit code and must be differentiated by a fourth bit. Only five instructions actually compress data: "010,1", "100", "101", "110", and "111". A 1-byte number for the length is an unsigned integer that can specify a position from 0 through 255. A 2-byte number for the length is an unsigned integer that can specify a position from 0 to 65,535. A 3-byte number for the length is an unsigned integer that can specify a position from 0 to 16,777,215. A 4-byte number for the length is an unsigned integer that can specify a position from 0 to 4,294,967,295. The first decompression instruction "000" does nothing, and processing would continue with retrieval of the following 3-bit decompression instruction, if there were one. This instruction was included so that if there are at least three "0" padding bits at the end of a compressed segment, then that apparent instruction would not be executed. Decompression instruction "001" defines a compressed segment by using 5-bits to specify the compression level for the segment and a four byte number to specify the total length in bytes of the following segment's decompression instructions. The segment length could be from 0 bytes to 4,294,967,295 bytes. The last byte of the segment may be padded with zeros so that each segment is an integral number of bytes. Its syntax is: {001, 5-bit CompLevel, 4-byte number for the length in byte units of the following segment}. If the compression level equals zero then the next instruction must be "010,0" for an original data instruction and is followed by the original data. Decompression instruction "010" has 2 possible interpretations, based upon the following bit. Decompression instruction "010" followed by a "0" bit defines the original data segment and is only produced with the compression level equal to zero. This instruction contains a 4-bit length descriptor that indicates the number of bytes that specify the length, and also indicates whether the original data's units are in bits or bytes. The 4-bit length descriptor is as follows: 0001 for 1-byte number for the length in bit units, 0010 for 2-byte number for the length in bit units, 0011 for 3-byte number for the length in bit units, 0100 for 4-byte number for the length in bit units, 0101 for 5 byte number for the length in bit units, 1001 for 1 byte number for the length in byte units, 1010 for 2-byte number for the length in byte units, 1011 for 3-byte number for the length in byte units, 1100 for 4-byte number for the length in byte units. The original data decompression instruction's syntax is: {010, 0, 4-bit length descriptor, 1 or 2 or 3 or 4 or 5 byte number for the length, original data}. The syntax of these two instructions will start the original data on a byte boundary. Decompression instruction "010", followed by a "1" bit produces a string with each byte set to a specified 8-bit background character. Its syntax is: {010, 1, 2-bit length descriptor, 1 or 2 or 3 or 4-byte number for the length in byte units, and an 8-bit background character for the string}. The 2-bit length descriptor is as follows: 00 for a 1-byte number for the length, 01 for a 2-byte number for the length, 10 for a 3-byte number for the length, and 11 for a 4-byte number for the length. This instruction can produce a string of the specified 8-bit background character whose length can be from 0 to 4,294,967,295 bytes long. Decompression instruction "011" specifies the 8-bit character that is referred to as the "current" character and resets the current position in the string to zero. This current character will be the one positioned until another character is specified as the current character. Its syntax is {011, 8-bit character code for the current character}. The last four decompression instructions will compress data if the number of positions specified is more than the length of the particular instruction. The first three instructions are for relative increments or distance from the current position, and the last instruction is for an absolute position. A current character is set at the new current position and at each additional position that is visited. The four instructions have a similar syntax: 3-bit instruction code, distance from current position or absolute position for the new current position to insert the current character, number of additional positions to insert the current character, and starting from the new current position the relative increment between each position. These four instructions can place a single character by specifying the number of additional positions to visit equal to zero. Decompression instruction "100" has the following meaning: from the current position, go to a 1-byte number for the distance, defining a new current position and insert the first current character, and visit a certain number of additional positions, starting from the new current position at a certain relative increment between each to insert the current character. It is 2 bytes and 3 bits long and therefore requires at least three positions to be defined for compression to occur. The first position in the instruction becomes the new current position, the other positions are only visited. This method was chosen so that there would not be any positions for the current character left behind that were not defined. The invention finds the next position in the string that needs the current character, goes to that position and makes it the current position, then it visits the other positions at regular intervals inserting the current character. Its syntax is: {100, 1-byte number for the distance, 4-bit number of additional positions to visit, 4-bit number for the relative increment between each position}. Decompression instruction "101" has the following meaning: from the current position, go to a 2-byte number for the distance, defining a new current position and insert the first current character, and visit a certain number of additional positions, starting from the new current position at a certain relative increment between each to insert the current character. It is 4 bytes and 3 bits long and therefore requires at least five positions to be defined for compression to occur. The first position in the instruction becomes the new current position, the other positions are only visited. Its syntax is: {101, 2-byte number for the distance, 1-byte number of additional positions to visit, 1-byte number for the relative increment between each position}. Decompression instruction "110" has the following meaning: from the current position, go to a 3-byte number for the distance, defining a new current position and insert the first current character, and visit a certain number of additional positions, starting from the new current position at a certain relative increment between each to insert the current character. It is 7 bytes and 3 bits long and therefore requires at least eight positions to be defined for compression to occur. The first position in the instruction becomes the new current position, the other positions are only visited. Its syntax is: {110, 3-byte number for the distance, 2-byte number of additional positions to visit, 2-byte number for the relative increment between each position}. Decompression instruction "111" has the following meaning: go to a 4-byte number for the absolute position, defining a new current position and insert the first current character, and visit a certain number of additional positions, starting from the new current position at a certain relative increment between each to insert the current character. It is 12 bytes and 3 bits long and therefore requires at least thirteen positions to be defined for compression to occur. The first position in the instruction becomes the new current position, the other positions are only visited. Its syntax is: {111, 4-byte number for the absolute position, 4-byte number of additional positions to visit, 4-byte number for the relative increment between each position}.

FIG. 2A lists several steps that work through specific sample data and produces an output at compression level 1. Hexadecimal numbers such as $D7_X$ have an X subscript.

String a) is a file that contains the specific input string that will be compressed. The entire data in the file contains 200 "A", 11 "B" and 2 "C", for a total of 213 characters. The ellipses indicate repeating "A" characters.

String b) presents the initial processing results. Two instructions are added to the beginning of the data. The first is "001", a beginning of compressed segment instruction, followed by a 5 bit compression level 00000, and a 4 byte number that indicates the total subsequent length:

00000000, 00000000, 00000000, 11010111. The second instruction is an original data instruction "010,0". It contains a 4-bit length descriptor 1001, to signify that the following is a 1 byte number for the length in byte units. The byte indicates that the original data are 11010101 bytes long, or $D5_X$, or 213 in decimal notation. It is followed by all of the original data.

String c) uses some hexadecimal notation for the binary codes in b) above. Seven bytes have been added to the original data, the total length is now 220 bytes and at compression level 0.

Table d) lists all of the different characters in c) above, and the counts for each character's occurrence in the data. Character "A" is the most numerous with 200 present in the data. It is chosen as the background character upon which all other characters will be written, overwriting some of these "A" background characters. The total length is now 220 bytes and so the instruction must produce a string with 220 "A" characters. It uses the "produce background string" decompression instruction "010,1". The complete instruction is: {010,1,00, 11011100,A}. A length descriptor of 00 signifies a 1 byte number for the length, and this byte specifies a length of 11011100, or $DC_X$, or 220 bytes. The "A" specifies the background character to use. The table lists the results of analysis for each character's coded decompression instructions. The instructions for character $00_X$ are described in e) and f). The instructions for character "B" are described in g) through j). First produce decompression instruction {011,$00_X$} to make character $00_X$ the current character and reset the current position to 0.

String e) is a temporary string of character $01_X$ that is 220 bytes long, the total length of the input data at compression level 0. The figure uses characters "0", "1", and "F" to represent $00_X$, $01_X$, $FF_X$ respectively for simplicity. The temporary string would normally be filled with character $00_X$, but it must be filled with character $01_X$, because character $00_X$ is being analyzed. Transfer character $00_X$ from c) above to its corresponding positions in e), the second, third, and fourth character positions. Find the first $00_X$. It is in position 2. Find the next $00_X$, and it is just 1 character away, therefore use character interval of 1 and find 2 other $00_X$, for a total of 3 characters. Find the next $00_X$, and it is just 2 characters away, therefore use an interval of 2 from the same second position and find only 1 more $00_X$ for a total of 2 characters. No other $00_X$ can be found, so the best count is 3, and best interval is 1. Produce instruction "100", with a 1 byte number for the relative position 00000010=2 in decimal, number of additional characters to change to the current character 0010=2 in decimal, and the character interval between each 0001=1 in decimal. The complete instruction is: {100,00000010,0010,0001}.

String f) presents the result of using the instruction on the temporary string e), but instead of writing character $00_X$, the overwrite character $FF_X$ is written to the string. Character $00_X$ is changed to the overwrite character $FF_X$ for further analysis. There are no more $00_X$ characters, and the routine would progress to the next character that is present in the input data as listed in table d). Temporary string g) is 220 bytes long and filled with character $00_X$. Use decompression instruction {011,B} to set B as the current character and reset the current position to 0. Character B is transferred from c) to its corresponding positions in order to analyze and produce its instructions. The first B is found at position 10. Find the next B, and it is just 1 character away, therefore use a character TestInterval=1, and find 4 more B characters until $00_X$ is encountered. Set ChangeCount=5 and PosCount=4. Find the next B, and it is 2 characters away, therefore use character TestInterval=2, and find only 3 more B characters, therefore TestInterval=1 is better. Find the next B, and it is 3 characters away, therefore use a character TestInterval=3, and find 6 more B characters, therefore TestInterval=3 is better. Set ChangeCount=7 and PosCount=6. Find the next B, and it is 4 characters away, therefore use a character TestInterval=4, and find 1 more B character, but TestInterval=3 is still better. Find the next B, and it is 6 characters away, therefore use TestInterval=6 and find 3 more B characters, but TestInterval=3 is still better. Continue this analysis while the TestInterval<(220−10+1)/ChangeCount. The best results are at TestInterval=3 and ChangeCount=7 and PosCount=6. Produce decompression instruction "100", with new current position distance of 00001010, additional character positions PosCount=0110, and character interval TestInterval=0011. The instruction is: {100, 00001010,0110,0011}. Use the instruction on temporary string g) to modify it to string h) by overwriting the specified B characters with the $FF_X$ overwrite character.

The next B in h) is in position 11, which is +1 distance away from the current position. Find the next B, and it is 1 character away in position 12, therefore use a character TestInterval=1, and find 3 more B or $FF_X$ characters until $00_X$ is encountered. Set ChangeCount=3, and PosCount=3 for the number of B or $FF_X$ found. Find the next B, and it is 3 characters away, therefore use a character TestInterval=3, and find 1 more B characters, but TestInterval=1 is still better. Find the next B, and it is 22 characters away, therefore use TestInterval=22, and find 1 more B Character. Continue this analysis while the TestInterval<(220−10+1)/ChangeCount. The best results are at TestInterval=1 and ChangeCount=3 and PosCount=3. Produce decompression instruction "100", with new current position increment of 00000001, additional character positions PosCount=0011, and character interval TestInterval=0001. The instruction is: {100,00000001,0011,0001}. Use the instruction on temporary string h) to modify it to string i) by overwriting the specified B or $FF_X$ characters with the $FF_X$ overwrite character.

Temporary string i) contains one more B character in position 33. The current position is 11, therefore the relative distance is 22. There are no more B characters, therefore ChangeCount=1, PosCount=0, and TestInterval=0. The decompression instruction that is produced is "100", with a relative distance of 22=00010110, additional character positions PosCount=0000, and character interval TestInterval=0000. The instruction is: {100,00010110, 0000,0000}. Use the instruction on temporary string i) to modify it to string j) by overwriting the specified B character with the $FF_X$ overwrite character.

Temporary string j) does not contain any more B characters, therefore the routine would progress to the next character with a count great than 0, the C character.

String k) is the output at compression level 1, after the routine is finished. The first instruction is: {001,00001, $00_X,00_X,00_X,22_X$}. The first three bits 001 specify the "beginning of compressed segment" instruction. It indicates a compression level=00001. It indicates that there are 34 subsequent bytes beyond this instruction using a 4-byte number to specify the length as $00_X, 00_X, 00_X, 22_X$. The next instruction is 010,1 for the background character, which in this case is the "A" character. The complete instruction is: {010,1,00,$DC_X$,A}. The 00 length descriptor specifies a 1 byte length for the following number. That byte contains a number of $DC_X$, which is the length of the string to be produced, that is filled with the background character "A". The specified order for the other characters is not important, because these instructions will only overwrite the background character "A" or themselves. The instructions were taken in order from the table in d) which starts with character $00_X$ and ends with $D7_X$. The last 2 bits are for padding the last byte. This output can be input again, to check for further compression and produce a new set of decompression instructions at the next compression level, which would be compression level 2.

Figure 3:
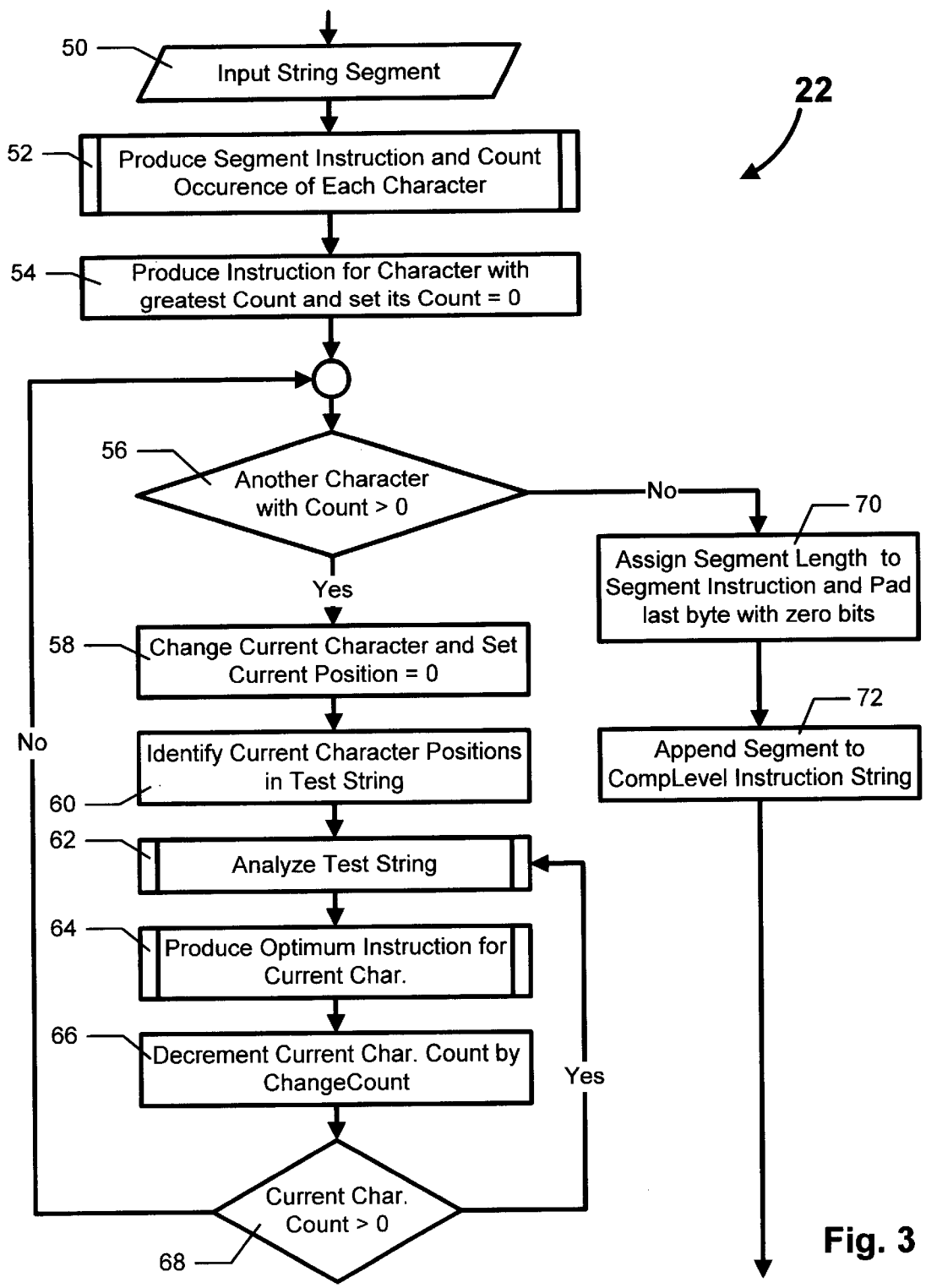
FIG. 3 is a flowchart of the Process Segment routine

FIG. 3 describes the Process Segment procedure 22 of FIG. 1. A segment instruction is produced that will be completed after the input segment has been fully analyzed. The segment instruction has a 4-byte length field that is temporarily set to zero and its syntax is: {001, 5-bit CompLevel, 4-byte length of the following segment decompression instructions set to zero}. Followed by decompression instructions that are appended to this segment instruction. The segment's 4-byte length will be set to the following decompression instruction string length after its segment decompression instructions have been appended. Block 50 represents the input data segment, which may be thousands or millions of bytes long. Procedure 52 produces an initial segment instruction: {001, 5-bit CompLevel, 4-byte length set to zero}. It also defines an array to count the occurrence of the 256 possible 8-bit character codes, and the last position for each character code, using the character code as the index. The array of counters is common and practiced in the art. Process 54 produces a decompression instruction for the 8-bit character with the greatest count, which is called the background character. It will produce a string segment the same length as input segment 50, and set each position to the character that has the greatest count, using them as background characters. Other characters will overwrite some of these background characters. Its syntax is described in FIG. 2 and is as follows: {010, 1, 2-bit length descriptor, 1 or 2 or 3 or 4-byte number for the length, 8-bit background character}. The 2-bit length descriptor and 1 or 2 or 3 or 4-byte number for the length can be determined from the required string segment length, and can be performed as practiced in the art. This decompression instruction must be produced before other decompression instructions for other characters, because the other instructions will overwrite many of these background characters. Process 54 also sets the count for this character with the greatest count (the background character) to zero so that it will not be processed in the following steps. Decision 56 checks if there is another character with a count greater then zero, by checking each of the 256 possible character codes, sequentially from $00_X$ to $FF_X$, and will branch to No only after all characters have been checked. If the count for a particular character is greater than zero, then the answer is Yes and proceeds to 58, where a decompression instruction to change the current character is produced, and the current position is reset to zero. Its syntax is: {011, 8-bit character code}. Another part of the invention is a Character Searcher that consists of process 60, procedure 62 and 64, process 66 and decision 68. Process 60 produces a temporary test string that is filled with 8-bit background character code $00_X$, unless the character that is being tested is character code $00_X$, in which case another character must be chosen for the test string background character, such as 8-bit character code $01_X$. A variable, such as TestBackChar is used to store the test string background character, either character code $00_X$ or character code $01_X$ for further processing. Another variable such as OverWriteChar is used to identify a position that had the current test character overwritten by a decompression instruction. This invention sets OverWriteChar to character code $FF_X$, unless character code $FF_X$ is being tested, then another character must be used, such as character code $FE_X$. The function of these two variables will be explained in FIG. 4. Process 60 also searches the input string segment and identifies each position that has the test character, which is the current character specified by 58, setting each corresponding position in the test string with the test character. Procedure 62 analyzes the test string to identify advantageous combinations of equidistant positions for the test character and will be described later in FIG. 4. Procedure 64 produces an optimum instruction for the current character and will be described later in FIG. 5. The instruction is appended to the compressed segment string. Process 66 decrements the current character count by the amount in ChangeCount, which is the number of current character positions modified by the decompression instruction. Decision 68 tests if the current character count is greater than zero. If the answer is Yes, then the process returns to procedure 62 to further analyze the test string. If the answer is No, then the process returns to decision 56, where another character with a count greater than zero is searched for. When decision 56 is No, after the 256 possible characters have been tested, then all of the characters have been accounted for in the input test string and all decompression instructions have been produced and added to the compressed segment. Process 70 is as practiced in the art and determines the length in bytes of the decompression instructions, padding the last byte with zeros if necessary, and stores the value in the 4-byte length field that was initially set to zero at the beginning of this procedure. The segment may not end on a byte boundary because of the various segment decompression instructions produced, so that the last byte may need some "0" padding bits to complete it. Process 72 appends the entire segment that was just produced to a string in an array of strings based upon the compression level as practiced in the art.

Figure 4:
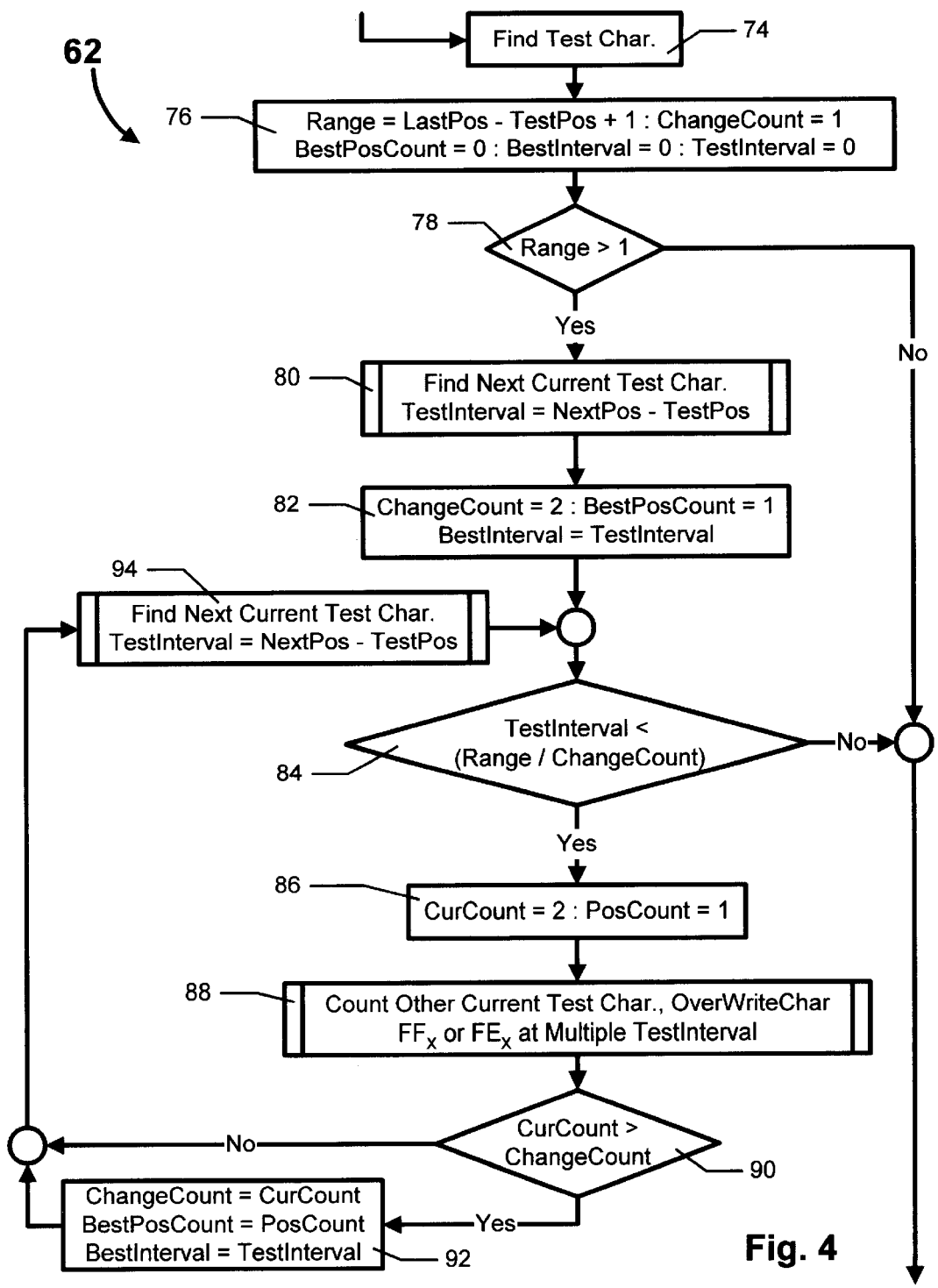
FIG. 4 is a flowchart of the Analyze Test String routine

FIG. 4 is for procedure 62, Analyze Test String in FIG. 3. Process 74 searches the test string sequentially for the first position of the current test character as practiced in the art. Its position is stored in a variable such as TestPos. Process 76 calculates the range. The last position was initially stored in 52. The range is equal to the last position minus the TestPos plus one. A variable such as ChangeCount, stores the number of current characters that can be set with a particular instruction and is set to 1 for this test position. A variable such as BestPosCount stores the best number of additional positions to visit in order to place the current character, and is initially set to zero. A variable such as BestInterval stores the best interval to use between each current character, and is initially set to zero. A variable such as TestInterval is initially set to zero. Decision 78 tests whether the range is greater than one. If decision 78 is No, then there is only one position which is specified by TestPos, and exits the routine. If decision 78 is Yes, then there are other current characters to find in the test string and decompression instructions must be produced for them. Procedure 80 finds the next current test character in the test string whose distance from first current test character at TestPos is greater than the value stored in TestInterval. It then calculates this new distance as, next position minus test position and stores the value in TestInterval. Process 82 sets ChangeCount equal to 2, BestPosCount equal to 1, and BestInterval equal to TestInterval. Decision 84 tests whether TestInterval is less than Range/ChangeCount. If decision 84 is Yes, then a better interval may still be found and proceeds to process 86 where the current test character count is stored in a variable such as CurCount and is set to 2 and the number of positions visited is stored in PosCount and set to 1. Procedure 88 counts other current test characters and OverWriteChar at multiples of the test interval TestInterval, until test background character TestBackChar is encountered. TestBackChar is usually 8-bit character code $00_X$ or $01_X$. Process 88 increments both CurCount and PosCount if the position visited has the current test character, it only increments PosCount if the position visited has the OverWriteChar. The OverWriteChar is usually 8-bit character $FF_X$ or $FE_X$. It ends the search when it encounters the TestBackChar, character $00_X$ or $01_X$. Decision 90 tests whether CurCount is greater than ChangeCount, indicating a better interval was found and more characters can be positioned with the instruction. If Yes then 92 sets ChangeCount equal to CurCount, BestPosCount equal to PosCount and BestInterval equal to TestInterval, then proceeds to 94 which is the same routine as 80. If decision 90 is No, then it proceeds to 94. Process 94 finds the next current test character that is positioned after the TestInterval. This process continues until decision 84 results in No, because the TestInterval would produce a CurCount that is less than ChangeCount for any further testing and therefore exits the loop with the best values in ChangeCount, BestPosCount and BestInterval for further processing in the next procedure.

Figure 5:
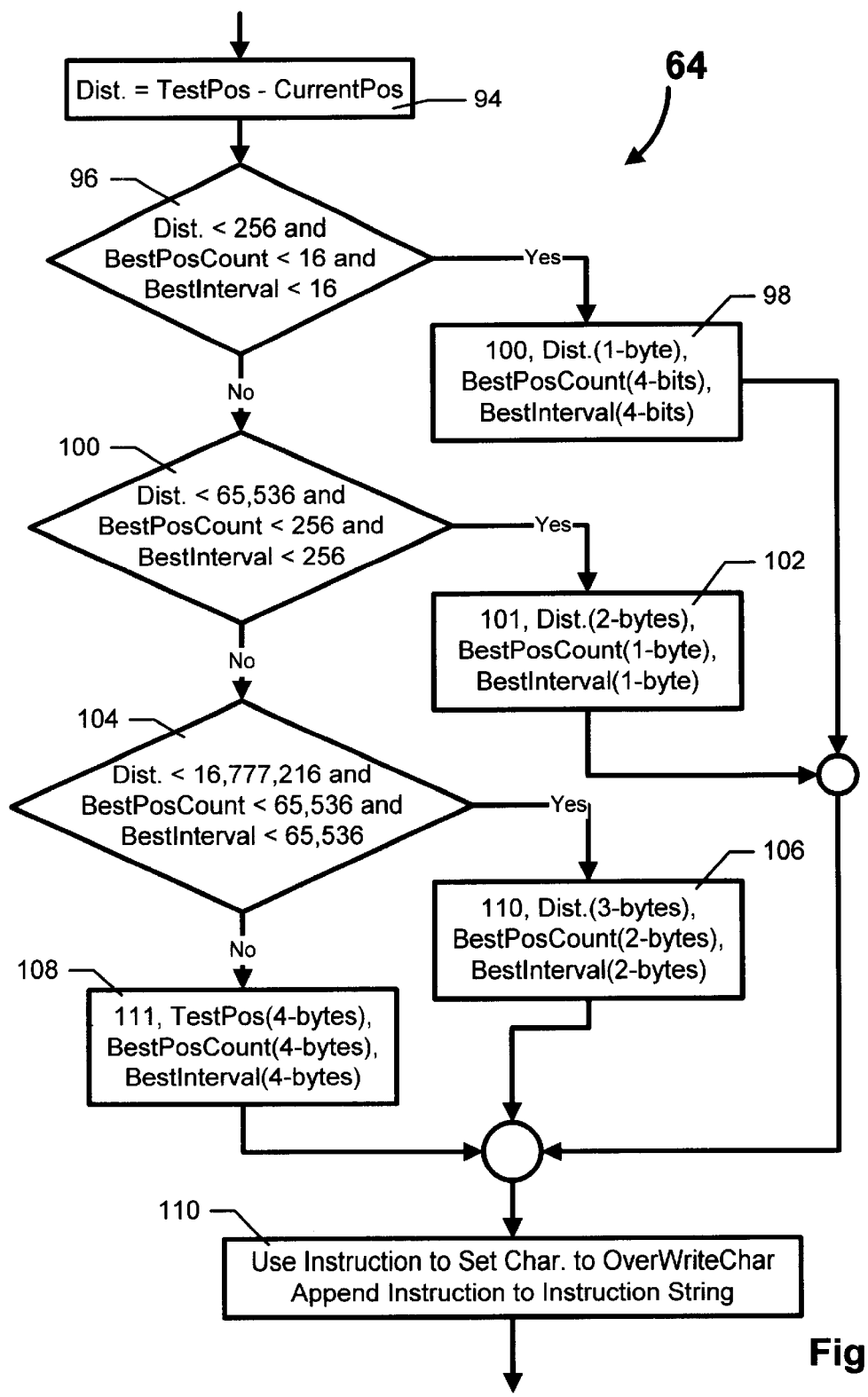
FIG. 5 is a flowchart of the Produce Optimum Decompression Instruction routine

FIG. 5 is for procedure 64, Produce Optimum Instruction of FIG. 3. It produces the shortest decompression instruction based upon three values: TestPos, BestPosCount, BestInterval. If there is only one position that needs to be specified and changed to the current character, as specified by the Distance or TestPos, then BestPosCount is equal to zero, otherwise each of the next four instructions will change two or more current character positions. The distance from the current position to the absolute test position may be used because it would be a smaller number and require a shorter decompression instruction. Process 94 sets a variable Distance equal to TestPos minus CurrentPos.

Decision 96 tests whether Distance is less than 256 and BestPosCount is less than 16 and BestInterval is less than 16. If the result is Yes, then 98 produces decompression instruction: {100, Distance(1-byte number), BestPosCount (4-bit number), BestInterval(4-bit number)}, and then proceeds to 110. If decision 96 is No, then decision 100 tests whether Distance is less than 65,536 and BestPosCount is less than 256 and BestInterval is less than 256. If the result is Yes, then 102 produces decompression instruction: {101, Distance(2-byte number), BestPosCount(1-byte number), BestInterval(1-byte number)}, and then proceeds to 110. If decision 100 is No, then decision 104 tests whether Distance is less than 16,777,216 and BestPosCount is less than 65,536 and BestInterval is less than 65,536. If the result is Yes, then 106 produces decompression instruction: {110, Distance(3-byte number), BestPosCount(2-byte number), BestInterval (2-byte number)}, and then proceeds to 110. If decision 104 is No, then 108 produces decompression instruction: {111, TestPos(4-byte number), BestPosCount(4-byte number), BestInterval(4-byte number)}, and then proceeds to 110. Process 110 uses the decompression instruction that was just produced to set the current position to TestPos and to change the specified positions in the test string to the OverWriteChar, which may be 8-bit character $FF_X$ or $FE_X$. Process 110 also appends the decompression instruction to the segment string and then proceeds to 66 in FIG. 3.

Figure 6:
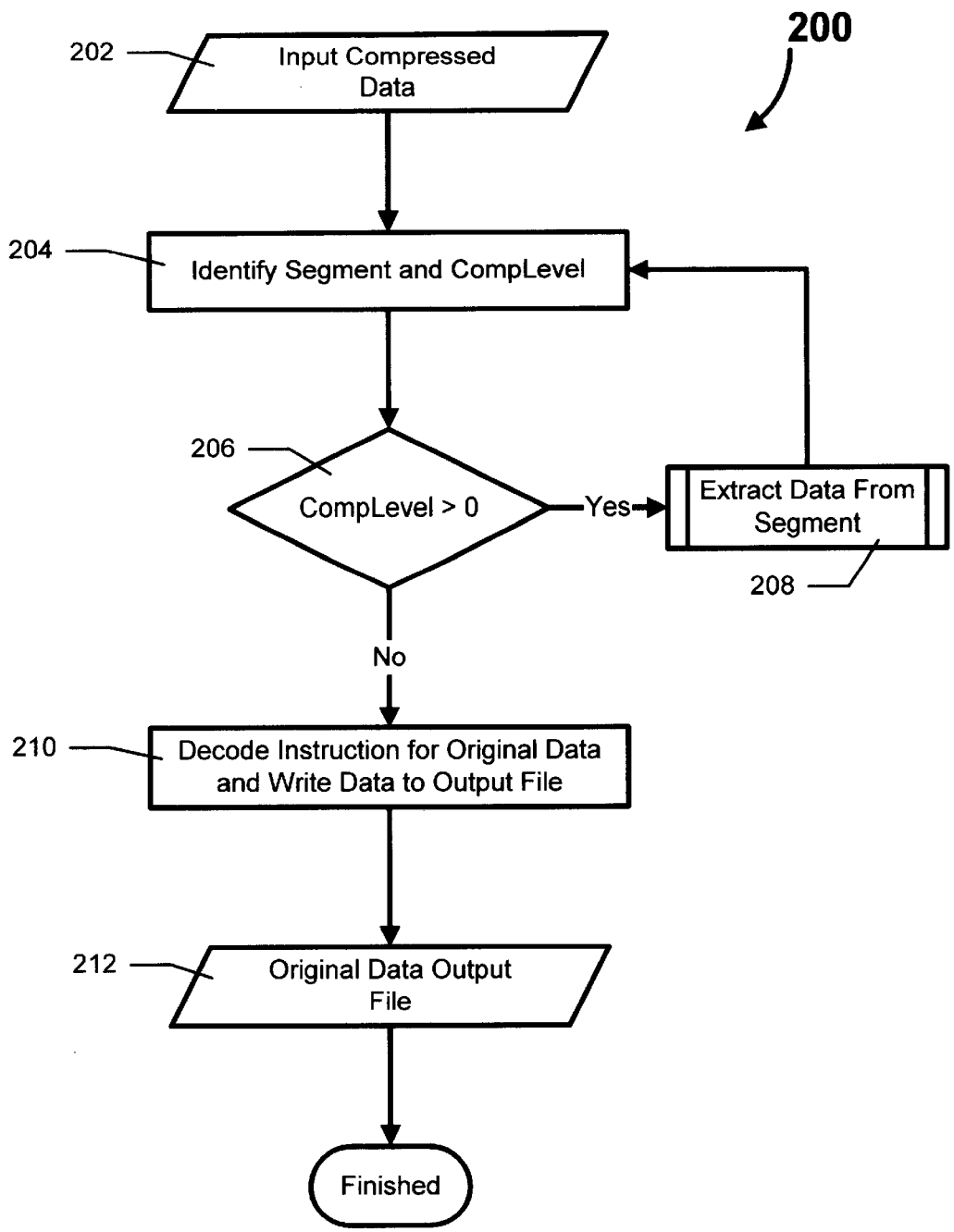
FIG. 6 is a flowchart of the decompression method

FIG. 6 is a flow chart for decompression method 200. Decompression is easily accomplished by executing the decompression instructions to extract the original data without any loss. Each decompression instruction is decoded by first retrieving the first 3 bits of the instruction to determine which instruction it is, and then based upon the instructions syntax, retrieving additional bits or bytes as required by the instruction. Execute the decompression instruction and proceed in a similar manner to decode the following decompression instructions until the entire segment has been decompressed. A segment may be composed of multiple sub-segments because the previous segment was very large and was divided into several sections, and each section produced a sub-segment, so that each sub-segment must be decompressed separately and the output appended to the previous sub-segment's output. The output may therefore be very large and may require the disk for processing and storage, and can be determined as practiced in the art. Input compressed data file 202 is analyzed in 204 to identify the segment and its compression level. Decode decompression instruction "001" for the segment to obtain its compression level and length in bytes. The segment must be decompressed until the 5-bit number CompLevel equals zero, remember that the compression level can range from 0 to 31. The segment decompression instruction is: {001, 5-bit CompLevel, length of following instructions in bytes (4-byte number)}. This instruction is followed by other instructions or if the compression level is zero, by an instruction for the original data. Decision 206 tests whether the compression level is greater than zero. If Yes, then procedure 208 extracts the data from a segment, and is explained later. Procedure 208 returns to 204 to again identify the segment and compression level. If decision 206 is No then this final segment is at compression level zero and contains an instruction for the original data, followed by the original data, and proceeds to 210, where the instruction for the original data is decoded and the original data are written to output file 212. As stated earlier, the original data instruction's syntax is: {010,0, 4-bit length descriptor for length and units of string, length of original data in bit or byte units, and original data}. The original data are written to output file 212 and decompression routine 200 is finished.

Figure 7:
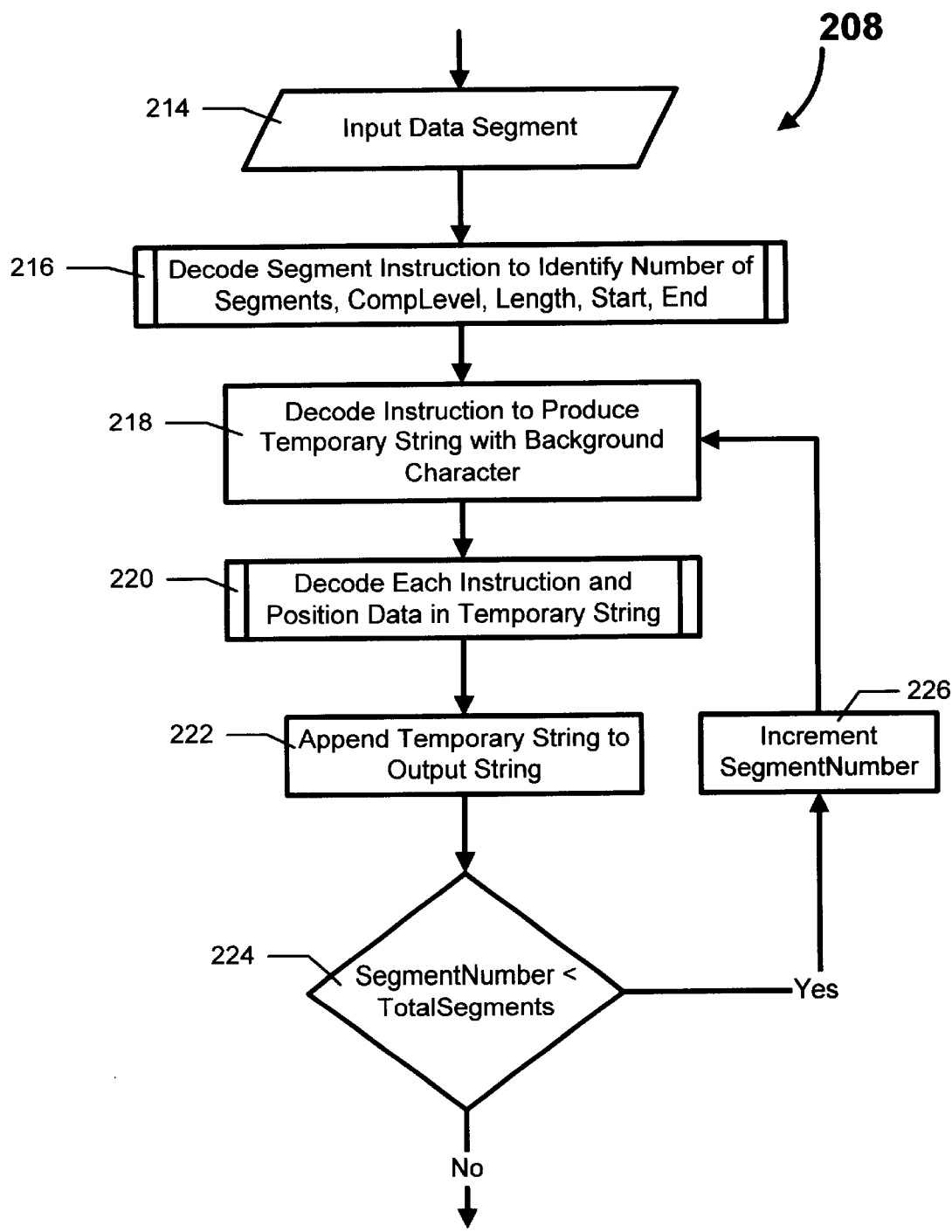
FIG. 7 is a flowchart of the Extract Data from Segment routine

FIG. 7 is a flow chart of routine 208, Extract Data from Segment. Input Data Segment 214 proceeds to 216, where segment instruction: {001, 5-bit CompLevel, length in bytes (4-byte number)}, is decoded to get the segment's data and identify the number of segments, the compression level, length in bytes, start position, and end position. Create an array such as SegmentData that is indexed by a variable such as SegmentNumber, to store this segment's or its sub-segments' starting position, length, and ending position. When the total number of segments has been determined then store it in a variable such as TotalSegments and set SegmentNumber to one. This primary segment may be composed of multiple sub-segments, so that each sub-segment must be decompressed separately and the output appended to the previous subsegment's output. If the next instruction is "001", then this primary segment contains multiple sub-segments. A segment instruction at a particular compression level can only have one layer of sub-segments, and each sub-segment is at the primary segment's compression level. If this primary segment does not have any sub-segments then the starting position for the first instruction after the 5-byte segment instruction would be 6, the total length for all its decompression instructions would be as specified in the segment instruction, and the ending position for the last decompression instruction would be (6−1+ Length). Store its data in array SegmentData with the index SegmentNumber equal to one and proceed to 218. If the primary segment is composed of multiple sub-segments, then the instruction at byte 6 is for the first sub-segment instruction. Decode this 5-byte sub-segment instruction to store the starting position for the first instruction after the 5-byte sub-segment instruction, which is position 11, the length as specified in the sub-segment's length field, and the ending position (11−1+Length). Store the data in array SegmentData with index SegmentNumber equal to one and advance to the next sub-segment. Decode the next sub-segment, increment the index SegmentNumber by one and store its start position, length, and end position in a similar manner. Repeat this process so that all sub-segment data are stored in array SegmentData. When the end position is equal to the primary segment's end position then all subsegments have been accounted for. Set the SegmentNumber to one. Process 218 decodes the first instruction specified by the starting position stored in array SegmentData for the instruction string, which must be an instruction to produce a temporary string with a specified background character. Its syntax is: {010, 1, 2-bit length descriptor, length of string, background character}. There are two decompression instructions with the same 3-bit code "010", and therefore a fourth bit must be used to determine which instruction it is. If the following bit is a "0" then it is an original data instruction, if the following bit is a "1" then it is an instruction to produce a string with an 8-bit background character. As described earlier, first retrieve the first 3-bits to determine which instruction it is and its syntax, then retrieve the remaining bits or bytes as required and execute the instruction. As an example for instruction "010" to produce a string, first retrieve 3-bits to get instruction "010". Based upon its syntax, the next bit must be retrieved to determine which instruction it is. Retrieve the bit and it should be a "1" and therefore the next 2-bits specify the number of bytes for the length field. Retrieve the next 2-bits and if "00" the length field is a 1-byte number, if "01" then a 2-byte number, if "10" then a 3-byte number, and if "11" then a 4-byte number". Assume that the length descriptor is "10", then the next 3 bytes contain a binary number for the length of the string that can range from 0 to 16,777,215 bytes. Retrieve the 3-bytes to determine the length. Also retrieve the next byte which specifies which character to use for the 8-bit background character of the temporary string. This background character was the one that had the greatest count when the previous compression level segment or segment section was analyzed. This temporary string will be used as a background upon which subsequent characters will be positioned. Process 220 decodes subsequent decompression instructions in a similar manner, which include instruction "011" for changing the current character and resetting the current position to zero, and instructions "100", "101", "110", and "111" for positioning either single or multiple current characters. Each instruction is executed to position the specified current character. When 220 is finished with the primary segment or sub-segment by reaching the end position in the instruction string as is specified in array SegmentData, it will proceed to 222 where the temporary string is appended to the output string and produces a new segment or section of a segment that must have a compression level that is one less then the current level. Decision 224 tests whether the SegmentNumber is<TotalSegments and if Yes, proceeds to 226 which increments SegmentNumber by one and returns to 218 to decode the next sub-segment whose starting position, length, and ending position is stored in array SegmentData. Decode and execute any sub-segment instructions in a similar manner. If decision 224 is No, then the primary segment or all sub-segments have been decoded and executed, with the data in the output string and returns to 204 in FIG. 6 for further processing.

CLAIMS

The embodiments used an 8-bit character set, but any other character set could be used, even a binary character set could be used. It therefore should be understood that the embodiments that were described are only exemplary and that someone skilled in the art may make many changes and use many variations without departing from the scope and spirit of the invention as defined in the appended claims.

I claim:

1. A decompression language for compressing original data by replacing said original data with decompression instructions, and said decompression instructions may be executed to retrieve said original data without any data loss; the decompression instructions are characterized by: counting an occurrence of the number of times each character appears in a string of characters; filling a string of data with background character which is the character that has the highest number of occurrences; overwriting one or more said background character at required positions within the string of data of said background character with subsequent current character, whose number of occurrences in the string of characters is greater than zero, and is positioned based on its positions within said string of characters and the decompression instructions; wherein a new data string at compression level zero is first developed and is comprised of a compressed segment instruction at compression level zero and an original data instruction and said original data, then compressed segment instruction at compression level 1 is produced to start a new data string at compression level 1, and said new data string at compression level zero is analyzed to count the occurrence of each possible character within said new data string at compression level zero, and the character with the greatest count is chosen and defined as the said background character, and an instruction is produced that will produce a string whose length is equal to the length of said new data string at compression level zero, and fill it with said background character, then said background character's count is set equal to zero, and each said character with a count greater than zero will in turn become the said current character, and instructions will be produced for each said current character, and said current character will be positioned at required locations to overwrite one or more said background character of said string, developing another set of decompression instructions in a said new data string at compression level 1, and at higher compression levels if each subsequent new data string is repeatedly compressed, said decompression language comprising:

a) a non executing decompression instruction;

b) a decompression instruction for defining a compressed segment, its compression level, and length;

c) a decompression instruction for defining said original data, its length and units;

d) a decompression instruction for producing a string of a specified length, whose length is equal to the length of said new data string, and filled with a specified said background character;

e) a decompression instruction for changing to a new said current character, and resetting the current position in a string to zero;

f) decompression instructions for positioning a single said current character at a distance from the current position, defining a new said current position and positioning from said new current position at a specified interval, a specified number of additional said current characters, each successive said current character at said specified interval between each said current character;

g) and decompression instructions for positioning a single said current character at an absolute position, defining a new said current position and positioning from said new current position at a specified interval, a specified number of additional said current characters, each successive said current character at said specified interval between each said current character.

2. The decompression language of claim 1 wherein each said current character is an 8-bit character or byte, said decompression instructions are defined by 3-bits, and each said decompression instruction has its defined syntax, wherein said decompression instructions and syntax are comprised of:

a) said non executing decompression instruction is defined by 3-bits;

b) said compressed segment decompression instruction is defined by 3-bits followed by a 5-bit compression level that has a range from 0 to 31, and a 4-byte number for the length of the compressed segment in said byte units;

c) said original data segment decompression instruction is defined by 3-bits followed by a "0" bit, and a 4-bit length descriptor, the length of said original data in 1 or 2 or 3 or 4 or 5 bytes in bit or byte units as specified by said 4-bit length descriptor, and followed by all of said original data;

d) said decompression instruction to produce a string of a specified byte background character is defined by 3-bits followed by a "1" bit and by a 2-bit length descriptor, the length in bytes of said string is defined by a 1 or 2 or 3 or 4 byte number as specified by said 2-bit length descriptor, and is followed by specified said byte background character;

e) said decompression instruction to change to another said current character is defined by 3-bits followed by said byte that is said current character, and said instruction also resets said current position to zero;

f) said multiple position decompression instructions that place said current character at a relative position from said current position are each defined by 3-bits followed by a distance from said current position which defines a new said current position, said distance is a 1-byte to 4-byte number, the number of additional positions to place said current character is a 4-bit to 4 byte number, and said interval between each said current character is a 4-bit to 4-byte number;

g) said multiple position decompression instructions that place said current character at an absolute position are each defined by 3-bits followed by an absolute position which defines a new said current position, said absolute position is a 1-byte to 4-byte number, the number of additional positions to place said current character is a 4-bit to 4 byte number, and said interval between each said current character is a 4-bit to gbyte number.

3. The decompression language of claim 2, wherein said decompression instructions and syntax are composed of:

a) said non executing decompression instruction is defined by the 3-bits "000";

b) said compressed segment decompression instruction is defined by the 3-bits "001" followed by a 5-bit compression level number, and a 4-byte number that defines the length of the following compressed segment in said byte units;

c) said original data segment decompression instruction is defined by the 3-bits "010", followed by a "0" bit and a 4-bit length descriptor, length of said original data in 1 or 2 or 3 or 4 or 5 bytes in bit or byte units as specified by said 4-bit length descriptor, and followed by all of said original data;

d) said decompression instruction to produce a string of a specified background character is defined by the 3-bits "010" followed by a "1" bit and by a 2-bit length descriptor, the length in said bytes of said string is defined by a 1 or 2 or 3 or 4 byte number as specified by said 2-bit length descriptor, and specified said byte background character;

e) said decompression instruction to change to another said current character is defined by the 3-bits "011" followed by said byte that specifiese said current character, said instruction also resets said current position to zero;

f) said multiple position decompression instruction that places said current character at a relative position from said current position is defined by the 3-bits "100" followed by a distance from said current position which defines a new said current position, said distance is defined by a 1-byte number, the number of additional positions to place said current character is defined by a 4-bit number, and said interval between each said current character is defined by a 4-bit number;

g) another said multiple position decompression instruction that places said current character at a relative position from said current position is defined by the 3-bits "101" followed by a distance from said current position which defines a new said current position, said distance is defined by a 2-byte number, the number of additional positions to place said current character is defined by a 1-byte number, and said interval between each said current character is defined by a 1-byte number;

h) another said multiple position decompression instruction that places said current character at a relative position from said current position is defined by the 3-bits "10" followed by a distance from said current position which defines a new said current position, said distance is defined by a 3-byte number, the number of additional positions to place said current character is defined by a 2-byte number, and said interval between each said current character is defined by a 2-byte number;

i) said multiple position decompression instruction that places said current character at an absolute position is defined by the 3-bits "111" followed by an absolute position which defines a new said current position, said absolute position is a 4-byte number, the number of additional positions to place said current character is a 4 byte number, and said interval between each said current character is a 4-byte number.

4. A character searcher for identifying the locations of a particular test character within a data string and for producing decompression instructions based upon the search results; wherein said character searcher is characterized by finding a range which is the distance in the data string between a last position of said test character and an initial test position of said test character by using the last position of said test character minus said initial test position of said test character plus one; and finding a test interval which is the distance in a data string between an initial test position of said test character and a next sequential position of said test character by using said next sequential position of said test character minus said initial test position of said test character, and best position count is the greatest number of times said test character is found at a particular interval from an initial test position; and best interval is the particular interval that provides said best position count; said character searcher consisting:

a) means to produce a temporary test string that is the same length as said data string and said temporary test string is filled with a test background character such as character code $00_X$ or character code $01_X$;

b) means to sequentially search said data string for said test character and place said test character on said test string at corresponding positions;

c) means to analyze said test string for said test character by sequentially locating initial test position of said test character, calculating the range by last position of said test character minus said initial test position plus one, setting the change count to one, best position count to zero, best interval to zero, and test interval to zero, and if said range is greater than one, then search said test string for next sequential position of said test character, and calculating said test interval as said next sequential position minus said initial test position, setting change count to two, setting best position count to one, setting best interval to the value of test interval, and while said test interval is less than said range divided by said change count, then set test count to two and position count to one, and count said test character at multiples of said test interval, if character equals test character then incrementing said test count and said position count, if character equals overwrite character code $FF_X$ or code $FE_X$ then incrementing said position count, and stop counting when said test background character is encountered, and if said test count is greater than said change count then setting said change count to said test count, said best position count to said position count, said best interval to said test interval, then find the next sequential test character at next position after said test interval, setting said test interval to said next position minus said initial test position, ending the search when said test interval is greater than said range divided by said change count;

d) means to produce a multiple position decompression instruction using said initial test position, said best position count, and said best interval, and decrement said test character count by said change count;

e) means to execute said decompression instruction on said test string and place said overwrite character code $FF_X$ or code $FE_X$ at positions specified by said decompression instruction, and also append said decompression instruction to instruction string;

f) means to repeat the processes above starting at "c) means to analyze said test string for said test character", while said test character count in said test string is greater than zero.

5. A method of compressing data by using a decompression language and producing decompression instructions that replace said data; wherein a compression level is how many times a string has been compressed, from zero compression to a maximum of 31; and a string at said compression level zero contains the uncompressed original data string, and a string at said compression level 1 contains the compressed said compression level zero string, and a string at said compression level 2 contains the compressed said compression level 1 string, continuing to a string at said compression level 31 that contains the compressed said compression level 30 string; the decompression instructions are characterized by: counting an occurrence of the number of times each character appears in a string of characters; filling a string of data with background character which is the character that has the highest number of occurrences and is also the character with the greatest count; overwriting one or more said background character at required positions within the string of data of said background character with subsequent current character, whose number of occurrences in the string of characters is greater than zero, and is positioned based on its positions within said string of characters and the decompression instructions; and best position count is the greatest number of times said current character is found at a particular interval from an initial test position; and best interval is the particular interval that provides said best position count; and previous length is the string length of the previous set of decompression instructions at the current compression level minus 1; said method of compressing data consisting:

a) means to determine original data length of said data and whether said data are in bits or bytes, and produce an initial segment in a new data string by issuing a compressed segment decompression instruction with the compression level equal to zero, and an original data segment decompression instruction that contains said original data, then increment the compression level by one and produce a compressed segment instruction, then determine whether the new data string must be split into a plurality of sections based upon the length of said new data string and available memory;

b) means to input and process said new data string, or each section of said new data string consecutively by issuing a segment instruction for each section of said new data string at the current compression level, and count the occurrence of the possible unique characters within said new data string or section of said new data string, and produce a decompression instruction for the character with the greatest count which is the background character to fill a string whose length is equal to said new data string or section of said new data string, and reset its count to zero, and means for each said unique character with a count greater than zero to become the current character, for a character searcher to determine each said current characters positions within said string and issue optimum decompression instructions based on test position, best position count and best interval until each said characters positions have been identified, and repeat process above until all sections have been analyzed consecutively;

c) means to determine if current said decompression instructions have a total length less than the previous length, and if no then using the previous set of decompression instructions and write said previous decompression instructions to an output file or string, otherwise determine if a greater level of compression is desired and the current compression level is less than 31, and if no then using said current decompression instructions and write said current decompression instructions to an output file or string, otherwise discarding said previous decompression instructions at current compression level minus one, and using current set of said decompression instructions at said current compression level, as input for repeated processing at an incremented said compression level, until said previous length of decompression instructions at said current compression level minus one is less than said current set of decompression instructions at said current compression level, and write said previous decompression instructions at said current compression level minus one to an output file or string.

6. A method of decompressing decompression instructions based upon a decompression language, wherein original data is the original uncompressed input data from a file that was compressed; the decompression instructions are characterized by and were developed by: counting an occurrence of the number of times each character appeared in a string of characters; filling a string of data with background character which was the character that had the highest number of occurrences; overwriting one or more said background character at required positions within the string of data of said background character with subsequent current character, whose number of occurrences in the string of characters was greater than zero, and was positioned based on its positions within said string of characters and the decompression instructions; and said method of decompressing decompression instructions to retrieve the said original data, consisting:

a) means to identify segment decompression instruction and compression level;

b) means to determine if said compression level is greater than zero, and if it is, then extract data from said segment by decoding said segment to determine if there are sub-segments, number of subsegments and, compression level, length, start and end of said segment or each sub-segment, wherein any said sub-segments must be at the same compression level as said segment;

c) means for said segment or each said sub-segment to decode a decompression instruction to produce a temporary string with specified background character, and to decode each successive decompression instruction and execute said instructions to change the current character, and to position said current character on said temporary string, and when finished with said segment or each said sub-segment to append said temporary string to output string;

d) means to repeat steps a, b, and c above, while said compression level is greater than zero;

e) means to extract said original data when said compression level equals zero by decoding the decompression instruction for said original data and writing the output to a file or output string.

* * * * *